(12) United States Patent
Marques Da Silva Macedo et al.

(10) Patent No.: US 12,722,367 B2
(45) Date of Patent: Sep. 1, 2026

(54) METHOD FOR MANUFACTURING A DECORATIVE LAMINATE PANEL

(71) Applicant: Trespa International B.V., Weert (NL)

(72) Inventors: Isabel Maria Marques Da Silva Macedo, Weert (NL); Henricus Hubertus Maria Kömhoff, Weert (NL); Safae Larhziel, Weert (NL); Maria Pyrgeli, Weert (NL)

(73) Assignee: Trespa International B.V., Weert (NL)

( * ) Notice: Subject to any disclaimer, the term of this patent is extended or adjusted under 35 U.S.C. 154(b) by 64 days.

(21) Appl. No.: 18/719,775

(22) PCT Filed: Dec. 19, 2022

(86) PCT No.: PCT/NL2022/050730
§ 371 (c)(1),
(2) Date: Jun. 13, 2024

(87) PCT Pub. No.: WO2023/113605
PCT Pub. Date: Jun. 22, 2023

(65) Prior Publication Data

US 2025/0058556 A1 Feb. 20, 2025

(30) Foreign Application Priority Data

Dec. 17, 2021 (NL) ...................................... 2030172

(51) Int. Cl.
*B32B 37/18* (2006.01)
*B32B 3/04* (2006.01)
(Continued)

(52) U.S. Cl.
CPC ................ *B32B 37/18* (2013.01); *B32B 3/04* (2013.01); *B32B 15/08* (2013.01); *B32B 15/20* (2013.01);
(Continued)

(58) Field of Classification Search
CPC ...... H10F 19/80; H10F 19/804; H10F 19/807; H10F 19/85; H10F 77/30–48;
(Continued)

(56) References Cited

U.S. PATENT DOCUMENTS 4,401,839 A 8/1983 Pyle
4,789,604 A 12/1988 van der Hoeven
(Continued)

FOREIGN PATENT DOCUMENTS

CN 214753805 U 11/2021
DE 19811076 A1 9/1999
(Continued)

OTHER PUBLICATIONS

European Patent Office, International Search Report received in International Application No. PCT/NL2022/050730, Apr. 24, 2023, 5 pages.

*Primary Examiner* — Andrew J Golden
(74) *Attorney, Agent, or Firm* — Suiter Swantz IP

(57) ABSTRACT

The present invention relates to a method for manufacturing a decorative laminate panel, comprising an outermost decor layer, at least one photovoltaic element for converting the energy of light into electricity by the photovoltaic effect and a core construction, wherein the at least one photovoltaic element is located between the outermost decor layer and the core construction.
An object of the present invention is to provide a method for manufacturing a decorative laminate panel that is provided with a photovoltaic function where the photovoltaic function is seamlessly integrated into the decorative laminate panel and cannot be seen from the outside.

16 Claims, 3 Drawing Sheets

(51) Int. Cl.

| | |
|---|---|
| ***B32B 15/08*** | (2006.01) |
| ***B32B 15/20*** | (2006.01) |
| ***B32B 27/06*** | (2006.01) |
| ***B32B 37/12*** | (2006.01) |
| ***B32B 37/24*** | (2006.01) |
| ***H10F 19/80*** | (2025.01) |

(52) U.S. Cl.

CPC .............. *B32B 27/06* (2013.01); *B32B 37/12* (2013.01); *B32B 37/24* (2013.01); *H10F 19/804* (2025.01); *B32B 2037/243* (2013.01); *B32B 2255/10* (2013.01); *B32B 2255/12* (2013.01); *B32B 2255/26* (2013.01); *B32B 2255/28* (2013.01); *B32B 2309/02* (2013.01); *B32B 2309/04* (2013.01); *B32B 2309/12* (2013.01); *B32B 2451/00* (2013.01); *B32B 2607/00* (2013.01)

(58) Field of Classification Search

CPC .......... H02S 20/22; H02S 20/25; H02S 20/26; H02S 40/20; H02S 40/22; B32B 37/12; B32B 2451/00; B32B 2457/12; B44C 5/04

See application file for complete search history.

(56) References Cited

U.S. PATENT DOCUMENTS

| | | | | |
|---|---|---|---|---|
| 4,801,495 | A | 1/1989 | van der Hoeven | |
| 2005/0224108 | A1* | 10/2005 | Cheung | H10F 19/80 136/251 |
| 2011/0229663 | A1* | 9/2011 | Villarreal, Jr. | H10F 19/80 156/99 |
| 2011/0261288 | A1 | 10/2011 | Hong et al. | |
| 2012/0090661 | A1* | 4/2012 | Capps | H10F 19/80 136/246 |
| 2012/0305080 | A1* | 12/2012 | Funayama | H10F 19/85 438/66 |
| 2013/0078437 | A1 | 3/2013 | Symkens et al. | |
| 2021/0020586 | A1* | 1/2021 | Krajewski | H10F 19/804 |
| 2022/0140773 | A1* | 5/2022 | Zhang | H02S 20/26 136/251 |

FOREIGN PATENT DOCUMENTS

| | | | | |
|---|---|---|---|---|
| DE | 102008062809 | A1 | 7/2010 | |
| DE | 102012019421 | A1 | 6/2014 | |
| DE | 102013000135 | A1 | 7/2014 | |
| DE | 102015220573 | A1 | 4/2017 | |
| EP | 0867946 | A2 | 9/1998 | |
| EP | 2645013 | A1 | 10/2013 | |
| EP | 3405011 | A1 | 11/2018 | |
| EP | 3920241 | A1 | 12/2021 | |
| WO | 2010057787 | A2 | 5/2010 | |
| WO | 2017142412 | A1 | 8/2017 | |
| WO | 2020050713 | A1 | 3/2020 | |
| WO | WO-2020155628 | A1 * | 8/2020 | H10F 77/42 |

* cited by examiner

METHOD FOR MANUFACTURING A DECORATIVE LAMINATE PANEL

TECHNICAL FIELD AND BACKGROUND

The present invention relates to a method for manufacturing a decorative laminate panel, comprising an outermost decor layer, at least one photovoltaic element for converting the energy of light into electricity by the photovoltaic effect and a core construction, wherein the at least one photovoltaic element is located between the outermost decor layer and the core construction.

Decorative high-pressure compact laminates (HPL) are known for outdoor applications. Such laminates consist of layers of wood-based fibres (paper and/or wood) impregnated with thermosetting resins and surface layer(s) on one or both sides, having decorative colours or designs. A transparent topcoat is added to the surface layer(s) and cured to enhance weather and light protecting properties. These components are bonded together with simultaneous application of heat and high specific pressure to obtain a homogeneous non-porous material with increased density and integral decorative surface. These panels have been disclosed in, inter alia, U.S. Pat. Nos. 4,801,495, 4,789,604, US Patent application 2013/0078437. In the manufacture of HPL panels, the package, comprising the core layer and surface layer or layers, and the paper layers possibly located between them as well, is thermopressed to make a decorative panel; the thermosetting resins are cured in this process. The temperature is in the range from 120° C. to 210° C., the pressure is in the range from 10 to 100 bar, and the reaction time is from 1 to 90 minutes. However, if the core layer comprises a wood, plastic, or metal panel, then the temperature and pressure can usually be reduced as far as 80 DEG C. and 5 bar, respectively.

Such panels are non-intelligent panels. This means that the function of these panels is for construction and for aesthetic purposes only. But interactive panels are known in the art, for example panels provided with light sources.

One of the most widespread and investigated renewable energy sources is solar photovoltaic. Solar photovoltaic panels (PV modules) convert solar irradiation into direct electric power. Among the advantages of solar energy, it is worth noting that solar energy is considered to be noncontaminant, silent, very abundant, not centralized, free, and infinite, so all the above added up to the fact that PV panels have a long lifespan and a low maintenance cost. Normally, a solar panel system or installation consists of PV panels, batteries (if energy storage is desired in the case daytime and energy demand are not simultaneous), a charge controller (it protects batteries from overvoltage), and a control and distribution system (it provides the required voltage and current intensity for achieving most efficient usage). The photovoltaic generator is based on the photoelectric effect, that is, a material emits electrons when it is affected by electromagnetic radiation.

Photovoltaic panels for obtaining electrical energy from solar radiation are widely known. In order to convert solar energy into electrical energy, such panels comprise solar cells, in particular specially modified inorganic semiconductors. These standard modules are made into a thin plate by a suitable device, combined with a housing, and covered by a glass plate to protect it from environmental influences such as rain and snow. Photovoltaic panels fabricated in this manner can be installed in locations suitable for converting solar radiation into electrical energy. However, the photovoltaic panel is typically designed to be rigid, substantially inflexible and with a large weight, the weight is mainly determined by the base and cover of the photovoltaic module.

WO2020050713 in the name of the present applicant relates to a decorative high-pressure laminate (HPL) panel, comprising an outermost decor layer and a core layer, wherein the panel further comprises at least one photovoltaic element for converting the energy of light into electricity by the photovoltaic effect. The photovoltaic element is located between the outermost decor layer comprising a resin impregnated paper and the core layer.

German Offenlegungsschrift DE 10 2008 062809 relates to a method for producing a multilayer system for providing electrical functionality for a piece of furniture, comprising the following steps: producing a composite element which has at least one-layer decorative surface element and a functional layer, the functional layer having an electrical element with the electrical functionality, providing a backing layer and mechanically connecting the composite element to the carrier layer to obtain the multilayer system. Such a multilayer system for providing electrical functionality for a piece of furniture a composite element comprises an at least one-layer decorative surface element and a functional layer, the functional layer being an electrical element with electrical functionality; and a carrier layer, the composite element and the carrier layer being mechanically connected, wherein the electrical element is a switch, a sensor, a microphone, a light field, an organic light-emitting diode or a display device.

German Offenlegungsschrift DE 10 2015 220573 relates to a method for producing a decorative layer for an interior trim part of a motor vehicle, comprising the following steps: positioning a composite film on a visible side of a reference material, connecting the reference material with the composite film using a first seam, folding the cover material over the first seam so that an envelope is formed on the composite film with the cover material, which envelope covers part of one side of the composite film partially covered, with a further part of the side remaining free of the covering material, introducing a second seam into the composite film and the envelope.

WO2010057787 relates to a process for the production of a laminated board, in which the following steps are carried out in succession: provision of a plurality of cellulose fibre webs provided with an impregnation, formation of a layer by arranging the cellulose fibre webs provided with the impregnation one above the other, insertion of the layering into a hot press, compression of the layering while increasing the pressure and the temperature to form a base plate, extension of the base plate from the hot press and coating of the base plate, wherein during the step of pressing the layering, the temperature is increased to at least 155° C. and the pressure is increased to at least 15 Mpa.

European patent application EP 3 405 011 relates to method for producing an electronic device, such as a near field communication (NFC) device, a radio frequency identification (RFID) device, a photovoltaic cell, an emissive display, an energy harvesting device, a loudspeaker, or a multi-layer printed circuit board (PBC), comprising the steps of: providing or producing a plurality of sheets, wherein at least one of said sheets is a paper comprising a printed trace, pattern, and/or layer of an electronic ink and optionally providing or producing at least one sheet with a deposited or appended non-printed, in particular rigid, electronic component, optionally impregnating and encapsulating individually one or more sheets with a resin, assembling said plurality of sheets in a direction perpendicular to the plane of the sheets, optionally laminating the plurality of resin impregnated and encapsulated sheets and, recovering a flat or curved monolithic structure.

WO2017142412 in the name of the present applicant relates to a decorative panel, comprising a core layer provided with a decor layer, the decor layer comprising a substrate layer provided with at least one coating, wherein at least one light source is located within the decorative panel, the at least one light source is of the type Light Emitting Diodes (LEDs) chosen from the group of organic and inorganic LEDs, especially inorganic LEDs.

Functionalized panels are known in the art. For example German Offenlegungsschrift DE 10 2012 019 421 relates to an illuminated facade panel with an integrated light source, particularly in the form of a row-shaped light emitting diode array. In addition, US patent application publication No. 2011/261288 relates to a resin-type light guide plate composition, a backlight unit including the light guide plate formed using the composition, and a liquid crystal display including the backlight unit. German Offenlegungsschrift DE 198 11 076 relates to an illuminated laminar panel hot-pressed from resin prepregs and to a method for manufacturing such a panel.

Panel-like photovoltaic solar modules, used especially as a facade or roof element and having outer connection leads for electrical connection to further solar modules are known from EP 0 867 946. U.S. Pat. No. 4,401,839 teaches a solar panel comprising: at least one solar cell; a rigid transparent sheet overlying the cell; and a sheet of hardened aluminium foil beneath the cell and bonded to the cell and to the transparent sheet, wherein the panel includes upper and lower surfaces, and the foil sheet provides a hermetic seal along a portion of the lower surface.

German Offenlegungsschrift DE 10 2013 000 135 relates to a self-supporting façade or roof element, with a front panel and a heat exchanger element in installation orientation, the heat exchanger element is arranged on the inner side of the front panel so that a heat transfer between the front panel and the heat exchanger element is ensured, and connections for the supply and discharge of a heat transfer medium to the heat exchanger element. The front plate is a cement-bonded plate, a fibre cement board, or a natural stone slab or a HPL panel. Photovoltaically active elements can be attached to the outer surface of the front panel, in which case the electrical connection lines can be integrated into the facade element for this purpose.

European patent application EP 2 645 013 relates to a system of solar energy conversion panels configured for application to a vertical surface, the system essentially comprises one or more support brackets, applied vertically and parallel to each other onto the vertical support surface whereto the system is installed, one or more rows of arrays of photovoltaic panels, applied onto respective array support frames, one or more rows of frames, acting as supports for diffusing elements or panels applied onto said frames, one or more first upper coupling systems of the hinge type, adapted to couple the top side of the arrays of photovoltaic panels to the vertical support, one or more hinging systems, adapted to couple the bottom side of the arrays of photovoltaic panels to the top side of the diffusing elements, one or more carriages or sliding systems, adapted to slidably couple the bottom side of the diffusing elements to the support bracket. The diffusing panels may be manufactured by using machined, perforated, coloured metal sheets, e.g. made of aluminium, copper, metal mesh, stretched mesh, etc. The diffusing panels may be manufactured as self-supporting high-pressure laminates.

EP 3 920 241 relates to a power-generating panel having an optical adjustment layer, the optical adjustment layer is a translucent medium material, comprising a substrate, a power-generating layer, and the optical adjustment layer, wherein the substrate comprises one or more of glass, metal plate, cement-based plate, stone, concrete, tile, ceramic and engineering plastic and the power-generating layer comprises a solar cell sheet.

CN214753805 relates to a metal base material composite back plate and a power generation building material, the metal base material composite back plate comprises an upper functional layer, a metal base material and a lower functional layer from top to bottom in sequence, wherein the upper functional layer is provided with an upper metal coating, an upper chemical treatment layer, an upper high polymer material layer, an upper infrared ray reflecting layer and an upper high weather-proof insulating layer in sequence, and the lower functional layer is provided with a lower metal coating. The upper metal coating is arranged close to the metal base material, and the metal base material is a carbon steel, aluminum plate-based color steel plate or an aluminum-magnesium-manganese plate. The power generation building material sequentially comprises a light-transmitting glass layer, a power generation circuit layer, and a metal base material composite back plate layer from top to bottom, and the power generation circuit layer is bonded with the light-transmitting glass layer and the metal base material composite back plate layer through adhesive films.

An object of the present invention is to provide a method for manufacturing a decorative laminate panel that is provided with a photovoltaic function where the photovoltaic function is seamlessly integrated into the decorative laminate panel and cannot be seen from the outside, except for the necessary cables and electric connections.

BRIEF SUMMARY

Another object of the present invention is to provide a method for manufacturing a decorative laminate panel that is provided with a photovoltaic function wherein the mechanical properties of the decorative laminate panel including the photovoltaic function are maintained over a long period of time.

The present invention thus relates to a method for manufacturing a decorative laminate panel, comprising an outermost decor layer, at least one photovoltaic element for converting the energy of light into electricity by the photovoltaic effect and a core construction, wherein the at least one photovoltaic element is located between the outermost decor layer and the core construction, wherein the method comprises the following steps:

a) providing a core construction,
b) providing at least one photovoltaic element,
c) providing a décor layer,
d) constructing a stack of a), b), and c),
e) processing the stack of d) in order to obtain said decorative laminate panel having at least one photovoltaic element.

The present inventors found that with such a method for manufacturing a decorative laminate panel one or more of the aforementioned objects have been achieved. In more detail, by providing the core construction and the décor layer as ready-to-use elements for a stack consisting of a core construction, the at least one photovoltaic element, and a décor layer, such a stack will be processed in a laminator unit for manufacturing a decorative laminate panel having at least one photovoltaic element. The process conditions in the laminator unit are such that the photovoltaic element will be embedded between the core and the décor layer without damaging the photovoltaic element.

In an example step of the present method for manufacturing a decorative laminate panel step e) is chosen from the group of lamination and processing under elevated temperature and pressure.

In an example the at least one photovoltaic element is chosen from the group of organic photovoltaic (OPV), C-Si, for example of the back-contact type, and thin film, wherein the thin film is chosen from the group of amorphous crystalline, copper indium gallium selenide (CIGS) and CdTe, or combinations thereof. Organic Photovoltaic (OPV) devices convert solar energy to electrical energy. A typical OPV device consists of one or several photoactive materials sandwiched between two electrodes.

According to an embodiment of the present method a surface of the at least one photovoltaic element of b) is provided with an encapsulant layer, preferably the at least one photovoltaic element is sandwiched between one or more encapsulant layers. Such an encapsulant layer provides a dual function, i.e. a first function as an adhesive between the photovoltaic element itself and the core construction on the one hand and as an adhesive between the photovoltaic element itself and the décor layer on the other hand. In addition, the encapsulant layer also protects the photovoltaic element against damage, such as scratches and possible cracks.

In an example the construction further comprises one or more encapsulant layers. The presence of such encapsulant layers provides a decorative laminate panel having a dimensional stable and rigid structure, i.e. a panel that shows no undulations or curvatures.

In an example the core construction comprises, in succession, a back-side décor, a core, one or more encapsulant layers and a back-side décor.

In another example the core construction comprises, in succession, a back-side décor, a core, a back-side décor, and one or more encapsulant layers.

In an example of the present method for manufacturing the decorative laminate panel step e) comprises a lamination step. Such a lamination step is carried out a temperature in a range 100-160° C., a duration time between 20-30 minutes and a pressure less than 1 bar, preferably less than 0.8 bar, wherein the process conditions of the lamination step do not damage the photovoltaic element.

According to an embodiment of the present method the encapsulant layer is chosen from the group of elastomeric materials and non-cross-linking materials, wherein said elastomeric materials are especially ethylene vinyl acetate (EVA) and silicone-urethane (TPU) materials, wherein said non-cross-linking materials are especially thermoplastic polyolefin (TPO) polyolefin elastomer (POE) and polyvinyl butyral (PVB) and ionomer polymers. In an embodiment the encapsulant layer is a polymeric or copolymeric material with adhesive properties such as a glue, a thermoset resin, a thermoplastic resins, an elastomer and the like, and more particularly ethylene vinyl acetate (EVA), polyolefin elastomer (POE), polyvinyl butyral (PVB), silicone-urethane (TPU), polyolefin elastomer (POE) and ionomer polymers.

In another example of the present method for manufacturing the decorative laminate panel step e) comprises a press step under elevated temperature and pressure. Such a press step is carried out a temperature in a range 120-160° C., a duration time between 30-90 minutes and a pressure in a range of 40-80 bar.

In an example of the present method for manufacturing the decorative laminate panel such a method comprises both a lamination step and a step of application of a glue layer, namely:

- a step of laminating the at least one photovoltaic element, an encapsulant layer and the décor layer for obtaining a laminated composite, and
- gluing the laminated composite together with a core construction for obtaining the decorative laminate panel.

In an example of a decorative laminate panel manufactured via a press step e) the core construction further comprises a core, one or more encapsulant layers and a PV décor.

In another example of a decorative laminate panel manufactured via a press step e) the core construction comprises, in succession, an aluminium décor, a core, one or more encapsulant layers and an aluminium décor.

In an example the core is chosen from the group of resin impregnated papers, prepregs, non-wovens and wovens of wood fibres, glass fibres, textile fibres, synthetic fibres, metallic fibres, ceramic fibres and carbon fibres, or a mixture thereof, wherein said core preferably comprises a stack of resin impregnated papers. According to an embodiment prepregs, non-wovens and wovens of wood fibres, glass fibres, textile fibres, synthetic fibres, metallic fibres, ceramic fibres, carbon fibres, or a mixture thereof, can be used to replace the paper partly or completely in the resin impregnated stack.

In yet another embodiment the resin impregnated paper(s) can be replaced by a prepreg. Such a prepreg can be considered as a consolidated core of a fibre containing material comprised of wood or cellulose fibres which are coated with a thermosetting synthetic resin. The thickness of prepregs may be considerable larger than a typical paper, and may include thicknesses >1 cm, or even greater.

In an example the core comprises one or more flame retardants.

In an example the core and the intermediate core are provided with at least one outermost layer, wherein the at least one outermost layer comprises a coating layer comprising a radiation-cured resin chosen from the group of electron beam radiation (EBC) curable resins, UV radiation curable resins and X-ray radiation curable resins, or a combination thereof.

In an example the décor layer comprises a coated substrate layer, wherein the coated substrate layer preferably comprises a substrate layer provided with a base coat layer, the base coat layer is provided with a topcoat layer, the topcoat optionally provided with a release foil. In an example the décor layer consist of, in succession, a substrate, a pigmented base coat, a transparent topcoat and release foil for the desired finish.

In another example the base coat layer and the top coat layer comprise a radiation-cured resin comprises at least an oligomer selected from the group consisting of a polyether acrylate, a polyether methacrylate, an acrylic acrylate, an acrylic methacrylate, an epoxy-acrylate, an epoxy-methacrylate, a silicone-acrylate, a silicone-methacrylate, a polyester acrylate, a polyester methacrylate, a urethane acrylate, and a urethane methacrylate, especially an electron beam radiation (EBC) or UV curable oligomer.

In an example the base coat is printed with a patterned screen or coated as a uniform layer. In an example the base coat consists of solvent or water-based inks. In an example the base coat consists of radiation cured resins mixed with pigments.

In an example the substrate layer is a non-pigmented or pigmented substrate layer chosen from the group of paper, resin impregnated paper and polymeric foil, wherein the resin of the resin impregnated paper is preferably chosen from the group of thermoset resins, preferably based on resin from the group consisting of phenol resin, melamine resin, urea resin, epoxy resin, polyester resin, polyisocyanate resin, melamine acrylate, polyurethane acrylate, or combinations thereof.

In an example the substrate layer is paper based, i.e. no filler paper which when impregnated becomes translucent. In an example the substrate layer is PET based, i.e. a polymeric foil with a chemical treatment for promoting adhesion of acrylic coatings.

In an embodiment of the present method the resin of the resin impregnated paper is preferably chosen from the group of thermoset and thermoplastic resins, more preferably based on resin from the group consisting of phenol resin, melamine resin, urea resin, epoxy resin, polyester resin, polyisocyanate resin, melamine acrylate, polyurethane acrylate, or combinations thereof.

In an embodiment of the present method the resin impregnated paper and/or the polymeric foil comprise pigments, especially pigment patterns. In one embodiment of the invention, the pigments are selected from the group consisting of inorganic, coloured oxide pigments, inorganic pigments with hydroxyl groups, inorganic sulfidic pigments, carbon black pigments, phthalocyanine pigments and/or quinacridone pigments. In particular, the dye pigments are selected from the group consisting of titanium dioxide, zinc sulphide, zinc sulphate, red and yellow iron oxide, blue phthalocyanine pigments, carbon black pigments, oxidic black pigments and/or quinacridone pigments with violet-red shades.

In an embodiment of the present decorative laminate panel the step of laminating under vacuum comprises a step of heating, a step of evacuation, a step of pressure build up and a step of aeration.

The present invention also relates to a decorative laminate panel, comprising an outermost decor layer, at least one photovoltaic element for converting the energy of light into electricity by the photovoltaic effect and a core construction, wherein the at least one photovoltaic element is laminated to both the core construction and the outermost decor layer.

According to such a decorative laminate panel the at least one photovoltaic element is sandwiched between one or more encapsulated layers.

The present decorative laminate panel can be used in outside environmental areas, such as exterior walls, ceilings, and facades.

The advantages of the present decorative laminate panel can thus be identified as follows: non-visible, seamless integration, flatness of outer surface, encapsulation, i.e. protection against environment, whereas the physical properties of panel remain unaltered compared to a panel without the present photovoltaic element(s).

In an embodiment the outer cladding of a building consists of at least one decorative laminate panel as discussed above.

BRIEF DESCRIPTION OF THE DRAWINGS

Furthermore, further advantages and features of the present invention are apparent from the following description of preferred embodiments. The features described there and above can be implemented alone or in combination, provided that the features do not contradict each other. The description of the preferred embodiments is carried out with reference to the accompanying drawings.

DETAILED DESCRIPTION

Figure 1:
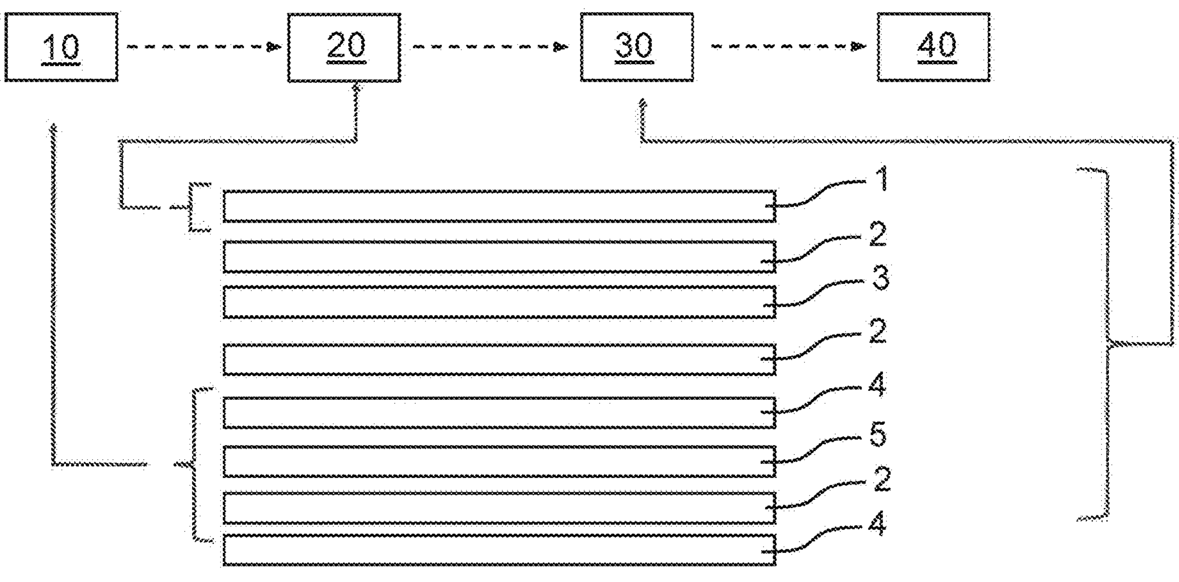
FIG. 1 is a schematic drawing of a method for manufacturing a decorative laminate panel via a lamination process.

In FIG. 1 different individual process steps for manufacturing a decorative laminate panel 40 are shown. The prepressed core construction 10 is prepared by applying a back-side décor 4 on both sides of a core 5, wherein one surface of the core 5 is provided with one or more encapsulant layers 2, for example two layers of EVA. In a separate process step 20 a décor layer 1 is manufactured. Such a décor layer 1 is the outermost layer of the final decorative laminate panel 40. In another separate process step the photovoltaic element 3 for converting the energy of light into electricity by the photovoltaic effect is provided with an encapsulant layer 2 on its outer surface layers, i.e. sandwiched between the encapsulant layer 2. The photovoltaic element 3 is thus “embedded” by two layers of encapsulant 2. In a final solar lamination process 30 the three discrete parts, i.e. prepressed core construction, encapsulated photovoltaic element and décor layer, are brought together and the final decorative laminate panel 40 is obtained. The décor layer 1 located close to the photovoltaic element 3 is a semi-transparent layer, i.e. a layer that permits the transmission of incident light to the photovoltaic element for converting the energy of light into electricity.

Figure 2:
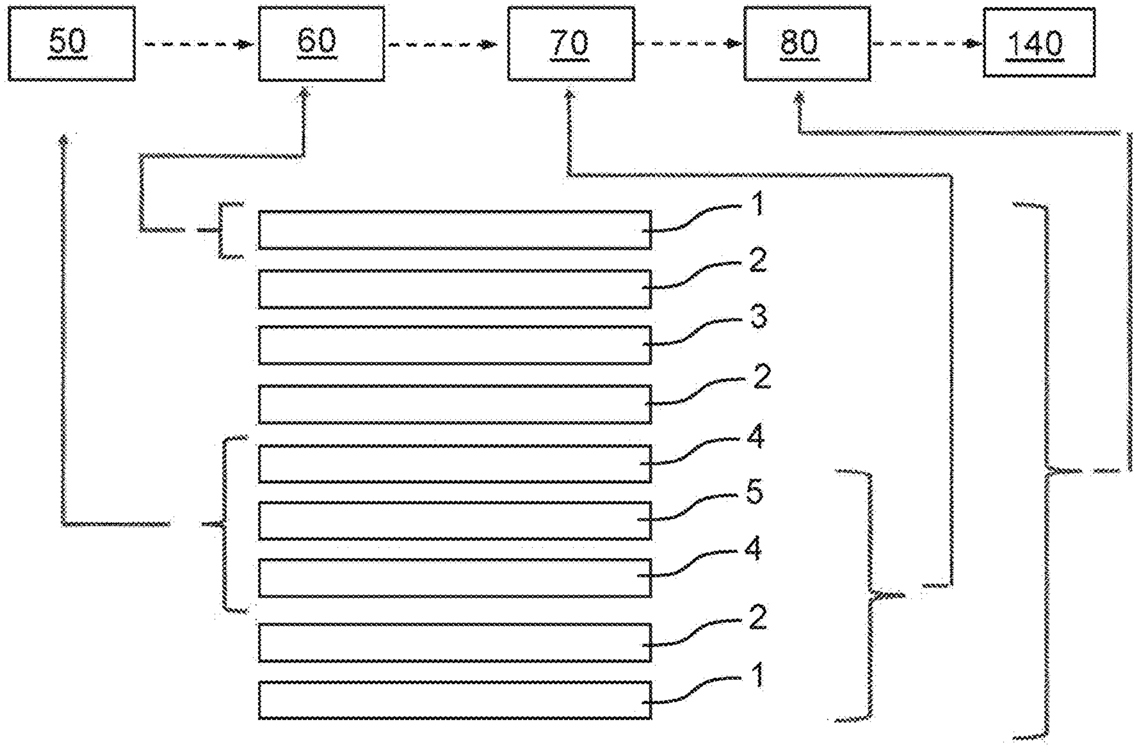
FIG. 2 is a schematic drawing of another method for manufacturing a decorative laminate panel via a lamination process.

In FIG. 2 another route for manufacturing a decorative laminate panel 140 is shown. A prepressed core 50 is prepared by applying a back-side décor 4 on both sides of a core layer 5. In a separate process step 60 a décor layer 1 is manufactured. Such a décor layer 1 is the outermost layer of the final decorative laminate panel 140. In another separate process step the photovoltaic element 3 for converting the energy of light into electricity by the photovoltaic effect is provided with an encapsulant layer 2 on its outer surface layers. The photovoltaic element 3 is thus “embedded” by two layers of encapsulant 2. In a separate process step the prepressed core is provided with an encapsulant layer 2 on one of its back-side décor layer 4. The encapsulant layer 2 is subsequently provided with an outermost décor layer 4 for obtaining the core construction. In a final solar lamination process 70 the three discrete parts, i.e. core construction, encapsulated photovoltaic element and décor layer, are brought together and the final decorative laminate panel 140 is obtained. The outermost layers of such a decorative laminate panel are décor layers 1. The décor layer 1 located close to the photovoltaic element is a semi-transparent layer, i.e. a layer that permits the transmission of incident light to the photovoltaic element for converting the energy of light into electricity.

Figure 3:
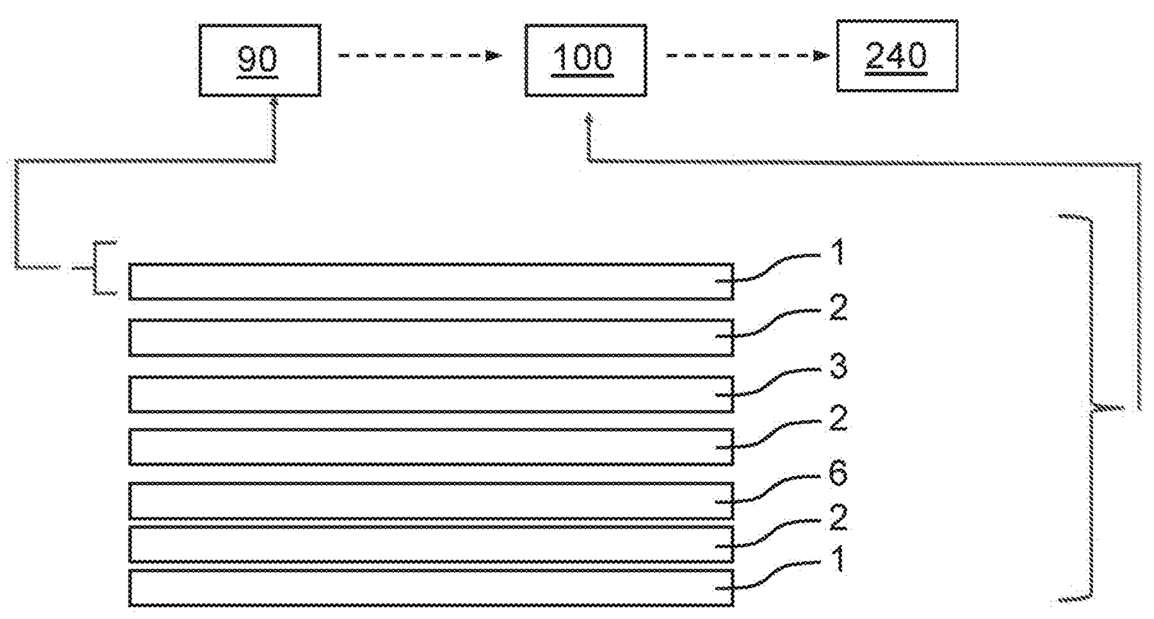
FIG. 3 is a schematic drawing of a method for manufacturing a decorative laminate panel via a press process.

FIG. 3 is a schematic drawing of a method for manufacturing a decorative laminate panel 240 via a press process. In a press several layers are brought into contact with each other, in succession, a décor layer 1, encapsulant layer 2, core 6, encapsulant layer 2, photovoltaic element layer 3, and encapsulant layer 2. In a separate process step 90 a décor layer 1 is manufactured. The décor layer thus manufactured is positioned on top of the encapsulant layer 2 and is a semi-transparent layer, i.e. a layer that permits the transmission of incident light to the photovoltaic element for converting the energy of light into electricity. The complete construction is pressed 100 in the press.

Figure 4:
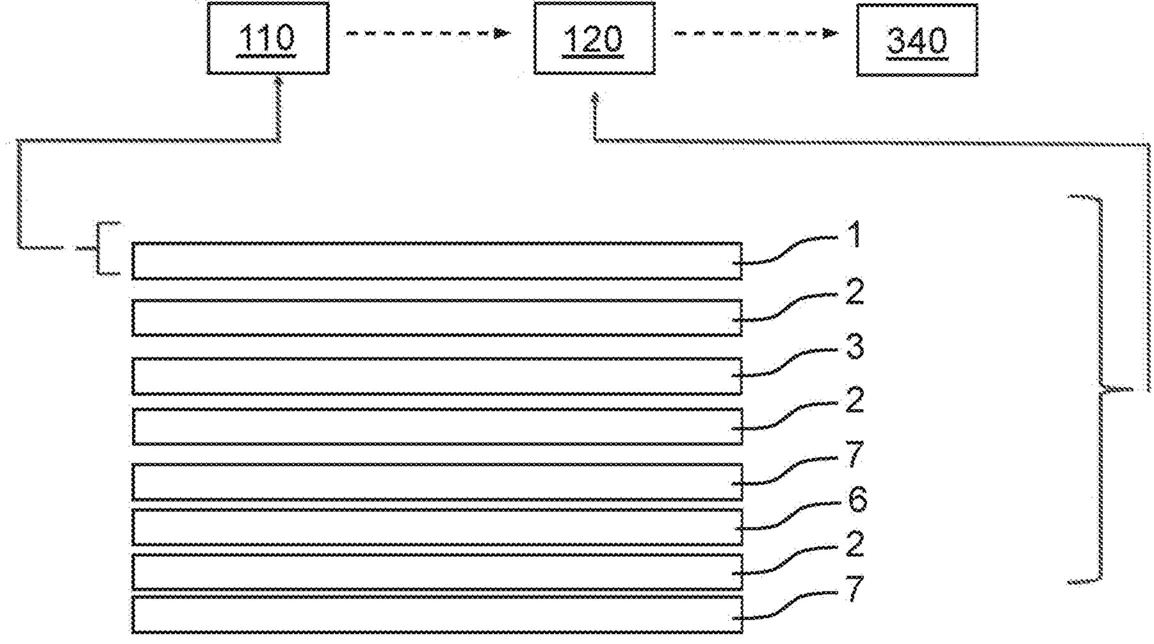
FIG. 4 is a schematic drawing of another method for manufacturing a decorative laminate panel via a press process.

FIG. 4 is a schematic drawing of another method for manufacturing a decorative laminate panel 340 via a press process 120. In a press several layers are brought into contact with each other, in succession, aluminium décor layer 7, encapsulant layer 2, core 6, aluminium décor layer 7, encapsulant layer 2, photovoltaic element layer 3, and encapsulant layer 2. In a separate process step 110 a décor layer 1 is manufactured. The décor layer 1 thus manufactured is positioned on top of the encapsulant layer 2 and is a semi-transparent layer, i.e. a layer that permits the transmission of incident light to the photovoltaic element for converting the energy of light into electricity. The complete construction is pressed in the press.

Figure 5:
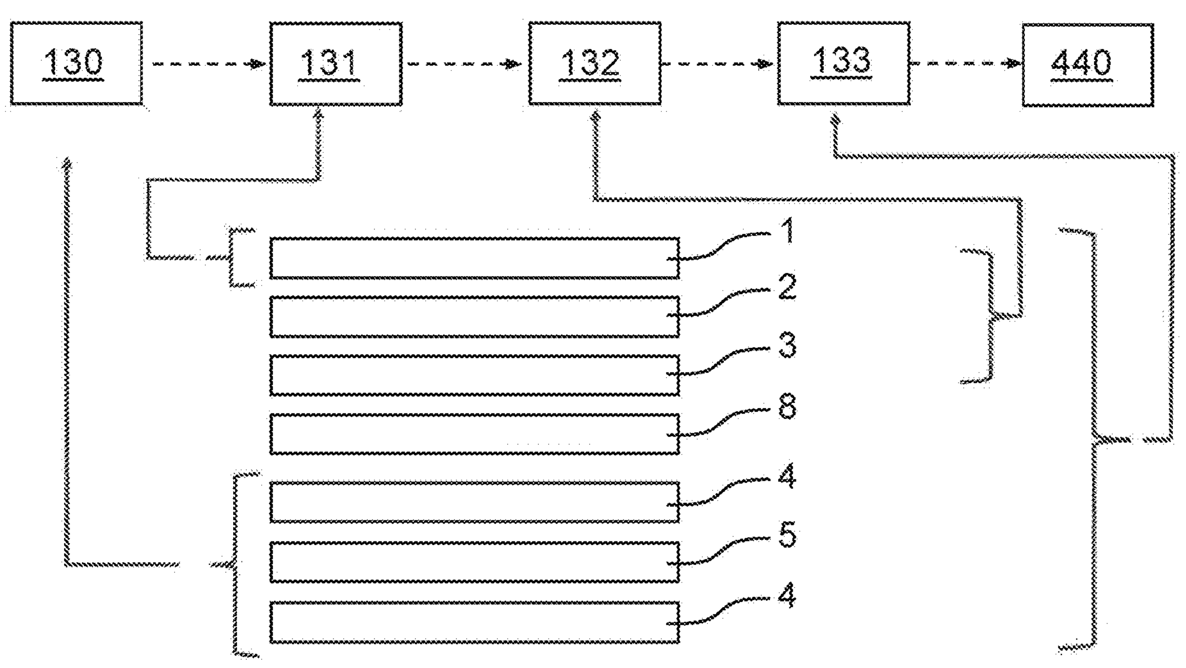
FIG. 5 is a schematic drawing of a method for manufacturing a decorative laminate panel via a lamination and gluing process.

FIG. 5 is a schematic drawing of a method for manufacturing a decorative laminate panel 440 via a lamination 132 and gluing 133 process. A prepressed core construction 130 is prepared by applying a back-side décor 4 on both sides of a core layer 5. In a separate process step 131 a décor layer 1 is manufactured. In a first lamination process 132 photovoltaic element layer 3, encapsulant layer 2 and décor layer 1 are laminated in that order. The décor layer 1 is positioned on top of the encapsulant layer 2 and is a semi-transparent layer, i.e. a layer that permits the transmission of incident light to the photovoltaic element for converting the energy of light into electricity. The laminated construction thus obtained is glued on top of the prepressed core construction, wherein the glue layer 8 is positioned between the photovoltaic element layer 3 and the back-side décor 4 of the prepressed core construction.

Figure 6:
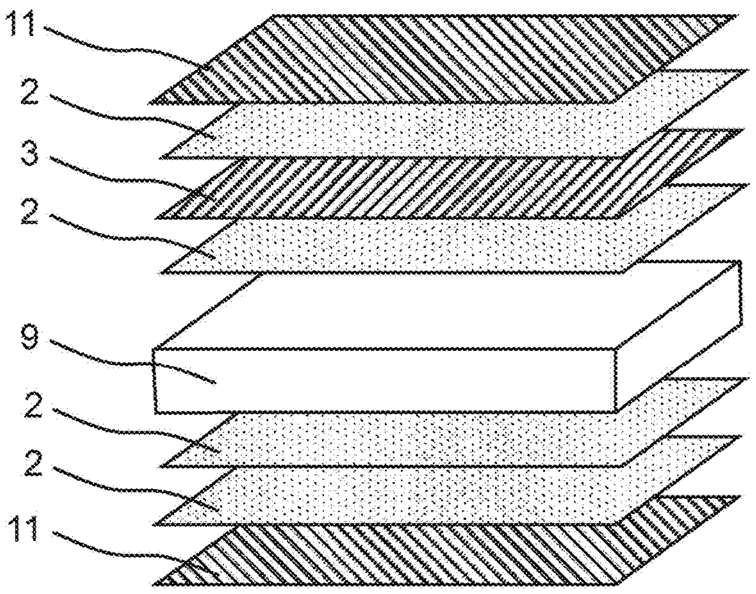
FIG. 6 is a schematic drawing of a decorative laminate panel.

FIG. 6 is a schematic drawing of a decorative laminate panel consisting of, in succession, a transparent printed paper 11, encapsulant layer 2, photovoltaic element layer 3, encapsulant layer 2, core 9, encapsulant layer 2 and a transparent printed paper 11.

The present inventors found that the process conditions of step e) affect the efficiency properties of the final decorative panel.

TABLE 1

| Efficiency loss after processing | | | |
|---|---|---|---|
| Type of PV | Press @ 160 C./70 bars | Press @ 120 C./40 bars | Lamination @ 120 C./1 bar |
| Organic thin film | Losses of 92% | Losses of 16% | Losses of 8% |
| a- Si thin film | Losses of 20% | Losses of 0% | Losses of 0% |
| Crystalline silicon | Solar cells break | Solar cells break | Losses of 0% |

The invention claimed is:

1. A method for manufacturing a decorative laminate panel, the method comprising the steps of:
   - producing a core construction in a first processing step, the core construction comprising resin impregnated papers;
   - producing an encapsulated photovoltaic element in a second processing step;
   - producing a décor layer in a third processing step;
   - arranging the core construction, the encapsulated photovoltaic element, and the décor layer to form a stack wherein the encapsulated photovoltaic element is positioned between the core construction and the décor layer; and
   - laminating the stack in a fourth processing step to form an integral lamination, wherein the fourth processing step is performed at a temperature in a range from 100° C. to 160° C., for a duration time from 20 minutes to 30 minutes, and at a pressure less than 1 bar.

2. The method according to claim 1, wherein the encapsulated photovoltaic element is embedded within at least two layers of encapsulant.

3. The method according to claim 2, wherein the encapsulant comprises polymeric or copolymeric material having adhesive properties selected from the group including a glue, a thermoset resin, a thermoplastic resin, an elastomer, ethylene vinyl acetate (EVA), polyolefin elastomer (POE), polyvinyl butyral (PVB), silicone-urethane (TPU), polyolefin elastomer (POE), and ionomer polymers.

4. The method according to claim 1, wherein the core construction comprises a core and one or more encapsulant layers, and wherein the core comprises the resin impregnated papers.

5. The method according to claim 4, wherein the core construction comprises, in succession, a first back-side décor, the core, the one or more encapsulant layers, and a second back-side décor.

6. The method according to claim 4, wherein the core construction comprises, in succession, a first aluminum decor, the core, the one or more encapsulant layers, and a second aluminum décor.

7. The method according to claim 4, wherein the core comprises an outermost layer comprising a coating layer comprising a thermally cured resin or a radiation-cured resin, wherein the radiation-cured resin is selected from the group including electron beam radiation (EBC) curable resins, UV radiation curable resins, X-ray radiation curable resins, or a combination thereof.

8. The method according to claim 1, wherein the fourth processing step comprises one or more of heating, evacuation, pressure build up, and aeration.

9. The method according to claim 1, wherein the fourth processing step comprises:
   - laminating the encapsulated photovoltaic element and the décor layer to obtain a laminated composite; and
   - gluing the laminated composite together with the core construction to obtain the decorative laminate panel.

10. The method according to claim 1, wherein the décor layer comprises a coated substrate layer comprising a substrate layer including a base coat layer, the base coat layer including a topcoat layer, and the topcoat layer optionally including a release foil.

11. The method according to claim 10, wherein the base coat layer and the top coat layer comprise a radiation-cured resin comprising at least an oligomer selected from the group including a polyether acrylate, a polyether methacrylate, an acrylic acrylate, an acrylic methacrylate, an epoxy-acrylate, an epoxy-methacrylate, a silicone-acrylate, a silicone-methacrylate, a polyester acrylate, a polyester methacrylate, a urethane acrylate, and a urethane methacrylate.

12. The method according to claim 10, wherein the substrate layer is a non-pigmented or pigmented substrate layer selected from the group including paper, resin impregnated paper, and polymeric foil.

13. The method according to claim 12, wherein the resin of the resin impregnated paper is at least one of a thermoset resin, a thermoplastic resin, a phenol resin, a melamine resin, a urea resin, an epoxy resin, a polyester resin, a polyisocyanate resin, melamine acrylate, and polyurethane acrylate.

14. The method according to claim 1, wherein the photovoltaic element is a thin film.

15. The method according to claim 1, wherein the décor layer is semi-transparent.

16. The method according to claim 1, wherein the first processing step, the second processing step, and the third processing step are performed in any order relative to one another, and wherein the fourth processing step is performed after completion of the first, second, and third processing steps.

* * * * *